(12) United States Patent
Kao et al.

(10) Patent No.: US 7,331,001 B2
(45) Date of Patent: Feb. 12, 2008

(54) TEST CARD FOR MULTIPLE FUNCTIONS TESTING

(75) Inventors: Han-Jung Kao, Taipei (TW); Shih-Chun Chen, Guishan Shiang (TW); Chun-Hsi Lin, Yi-Lan Shien (TW); Chih-Lang Lin, Taipei (TW); ShyhShin Lee, Taipei (TW)

(73) Assignee: O2Micro International Limited, Grand Caymen (KY)

( * ) Notice: Subject to any disclaimer, the term of this patent is extended or adjusted under 35 U.S.C. 154(b) by 442 days.

(21) Appl. No.: 10/819,571

(22) Filed: Apr. 6, 2004

(65) Prior Publication Data

US 2004/0268194 A1 Dec. 30, 2004

Related U.S. Application Data

(60) Provisional application No. 60/461,783, filed on Apr. 10, 2003.

(51) Int. Cl.
*G06F 11/00* (2006.01)
(52) U.S. Cl. .................. 714/25; 714/718; 714/42
(58) Field of Classification Search ............. 714/25, 714/42
See application file for complete search history.

(56) References Cited

U.S. PATENT DOCUMENTS

| | | | |
|---|---|---|---|
| 3,567,914 A * | 3/1971 | Neese et al. ............ 716/15 |
| 5,243,271 A * | 9/1993 | Lommers ............... 323/279 |
| 5,546,561 A * | 8/1996 | Kynett et al. ........... 711/163 |
| 5,546,591 A * | 8/1996 | Wurzburg et al. ....... 713/322 |
| 5,659,680 A * | 8/1997 | Cunningham et al. ..... 714/25 |
| 6,198,669 B1* | 3/2001 | Iguchi ............... 365/189.07 |
| 6,363,452 B1 | 3/2002 | Lach |
| 6,421,798 B1* | 7/2002 | Lin et al. ............... 714/718 |
| 6,434,499 B1 | 8/2002 | Ulrich et al. |
| 6,505,317 B1 | 1/2003 | Smith et al. |
| 6,704,827 B1* | 3/2004 | Smith et al. ............. 710/302 |

OTHER PUBLICATIONS

Capacitor—en.wikipedia.org/wiki/Capacitor☐☐Discharger—en.wikipedia.org/wiki/Discharger☐☐Counter—en.wikipedia.org/wiki/Counter☐☐Switch—en.wikipedia.org/wiki/Switch.*
Memory Stick—en.wikipedia.org/wiki/Memory_Stick☐☐SmartMedia—en.wikipedia.org/wiki/SmartMedia_Card☐☐MultiMediaCard—en.wikipedia.org/wiki/Multi_Media_Card☐☐
Secure Digital card—en.wikipedia.org.wiki/Secure_Digital_Card.*

* cited by examiner

*Primary Examiner*—Yolanda L Wilson (57) ABSTRACT

The present invention provides a test card for multiple functions testing. The test card includes a host of media devices, all of which reside on a single printed circuit board; and a selection device which selects each one of the host of media devices for testing. The test card can test all SD, MMC, MS (Pro), SMC devices and functions in one time in a bench without inserting and removing the media devices, thus accelerates the production line test speed.

19 Claims, 10 Drawing Sheets

TEST CARD FOR MULTIPLE FUNCTIONS TESTING

RELATED U.S. APPLICATION

This application claims priority to the copending provisional patent application, Ser. No. 60/461,783, entitled "Test Card for Multiple Function Testing," with filing date Apr. 10, 2003, and hereby incorporated by reference in its entirety.

FIELD OF THE INVENTION

The present invention relates to a test card apparatus, and more specifically, to a test card apparatus that supports multiple functions testing.

BACKGROUND OF THE INVENTION

Multiple function systems (e.g., computer systems, I/O expansion cards, etc.) may share a combined port/interface/slot to interface supported devices/functions. Those signals in the port/connector/slot are multi-function signals depending on the connected device. For example, the same pin on the combined port/connector/slot can support different function based on different devices. Only one device/function can work at the same time. For example, a CardBay PCMCIA slot is to allow connectivity of Smart card, Secure Digital, Multi-Media card, Smart Media and Memory Stick through the standard PC Card form factor. The controller in the computer will route the appropriate signals to the Card-Bay PCMCIA slot. The collective memory and Smart Card interfaces are intended to be optional in CardBay.

Using a single socket which can support multiple devices will allow notebooks to support all of these interfaces without the expense of additional dedicated sockets and will avoid the limitation of usage of border of notebook, and will make it easier for users to access various functions/devices with their notebook computer. For example, since CardBay cards will use the same socket as exsting 16-bit and CardBus cards, the CardBay signals are muxed with the 16-bit and CardBus signals in a PCMCIA/CardBus controller which supports PCMCIA proposal 0262. Whenever a CardBay card is inserted, the 68 pin PC Card interface will change to support the CardBay signals.

In order to test all the functions of the CardBay PCMCIA interface and related circuits/connectors, the conventional method has to insert one of the media device first for testing then remove it and insert the next media device for testing. In a word, it should insert and remove each device/function one by one and can not test all the functions in one time. Thus it takes time and manpower to handle the test of each device/function one by one. As more devices and protocols are introduced to the marketplace, it becomes even more tedious and time-consuming to test and ensure the operation of these new devices. And more insertion and removing will result contact issues on the combined port/connector/slot and the function (media) devices. It will also slow the production line test speed. Therefore, it reduces the testing efficiency and will cause contact issues on the tested combined port/connector/slot and the function (media) devices.

SUMMARY OF THE INVENTION

A test device for multiple functions testing consistent with the present invention includes a single interface with multi-function signals; a host of media devices, all of which reside on the single interface; and a selection device which selects each one of the host of media devices for testing.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein.

DETAILED DESCRIPTION

Figure 1:
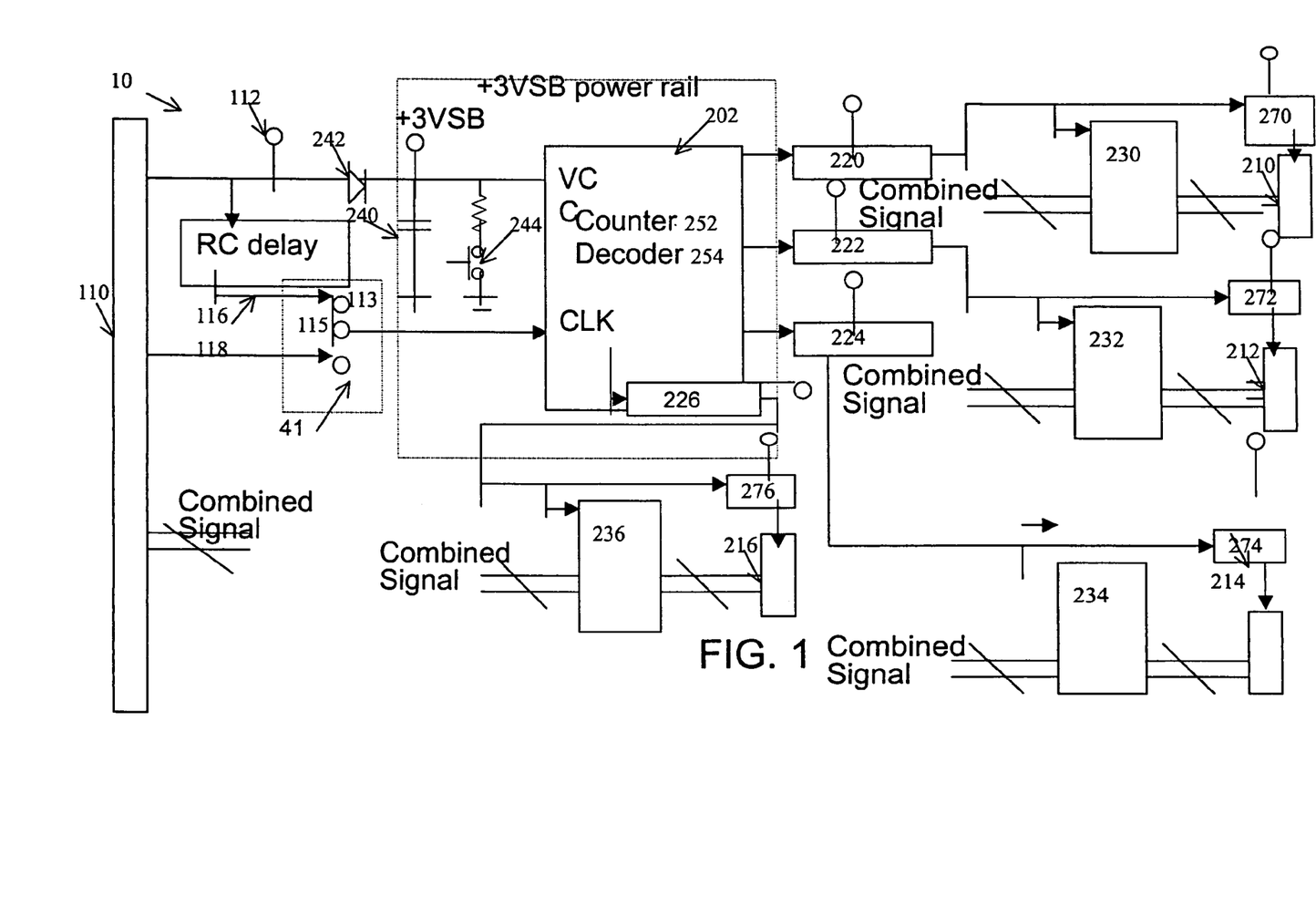
FIG. 1 is a detailed block diagram of one exemplary test card system.

FIG. 1 shows a detailed block diagram of one exemplary test card system 10. More specifically, system 10 is an exemplary test card system for testing a CardBay system through a PCMCIA interface 110 with a set of signals which are multi-defined for multi-functions. The present exemplary embodiments will be described herein with reference to a 68 pin PCMCIA interface 110. However, the present invention is not limited to the PCMCIA interface and is applicable to any multiple-function testing.

System 10 generally includes a state machine 202; a set of media devices including memory stick card (MS) 210, secure digital card (SD) 212, smart media card (SMC) 214, multi-media card (MMC) 216; a set of MOSFET buffers (220, 222, 224, 226); a set of quick switches (230, 232, 234, 236), and a capacitor 240. When the single test card with MMC, SD, MS, and SMC cards together is inserted into the 68 pin PCMCIA interface 110, the test program, the FIRST time, powers on the Socket_VCC power plane 112 in the PCMCIA interface. The Socket_VCC 112 is 3.3 volts in the present exemplary embodiment. The voltage drops across the diode 242 is about 0.3 volts, thus the voltage applied to state machine 202 is equal to about 3 volts. Thereby it forms a +3VSB power rail across the state machine 202. The diode 242 is used to separate the +3VSB power rail from Socket_VCC 112 for state machine 202. The capacitor 240 will be charged during Socket_VCC 112 is On and will keep providing power stable enough to keep the state of the state machine 202 when Socket_VCC 112 is temporary OFF in a short time during the test for switching to test the next function. Such that the state machine 202 will not be reset and will finish testing all selected functions/devices. It is even allowed that interface 110 to be powered OFF for reconfiguring the test for the next selected media device. Switch 244 is used for discharging power in capacitor 240. The clock source of the state machine 202 can be provided either by SQRYDR 118 from the corrsponding pin of PCMCIA interface 110 or by Delay_Socket_VCC 116 which is generated from Socket_VCC 112 through the RC delay filter 262 and Smith-trigger gates. There is a MODE jumper 41 to select one of the above clock sources. In the present embodiment, we will select Delay_Socket_VCC 116 as the clock source of the state machine 202 by shorting pin 113 and pin 115 of MODE jumper 41 together. Delay_Socket_VCC 116 is provided from the rising edge of the power of interface 110. Such that the power ON and OFF activities at the interface 110 could be used as a clock source for state machine 202. The state machine 202 generally includes a counter 252 and a decoder circuit 254. The clock of ripple counter 252 is the type of rising-edge triggered. The outputs of the two-bit counter 252 is used as SQRY3 and SQRY4 for decoder circuit 254 to select one of the SD, MMC, MS and SMC interface/device(210, 212, 214, 216). The decoder circuit 254 is to decode the outputs of ripple counter 252, and generates enabling signals for enabling coordinating quick switch (230, 232, 234, 236) and power MOSFET (270, 272, 274, 276) to enable proper interface path and power supply to selected media device (210, 212, 214, 216) (such as one of MMC, SD, MS, or SMC). The operation is as the following:

(a). As is understood in the art, once Socket_VCC 112 is powered on, the output of ripple counter 252 (SQRY3, SQRY4) is reset to (0,0), then get the rising edge signal from Delay_Socket_VCC 116, then ripple counter 252 changes to (1,1). The decoder circuit 254 will decode the outputs of ripple counter 252, and generates the corresponding enabling signal. Thus the MS path is enabled and selected for testing. The quick switches (230, 232, 234, 236) are used to isolate those signals defined at 68 pin PCMCIA interface 110 side from those signals for each SD, MMC, MS and SMC connector and card (210, 212, 214, 216). After power is stable on MS card 210, test program can RESET the card 210 and start to test it. After finishing the test, test program shows the test result to output (display or other devices) and powers OFF the Socket_VCC 112. The MOSFET buffer 220 is used to prevent the leakage from decoder circuit 254 to the quick switch 230 and others when Socket_VCC 112 is OFF.

(b). Test program takes a short delay here to discharge the Socket_VCC 112. The delay could not be taken too long because the +3VSB power still needs to keep stable.

(c). The test program then, the SECOND time, powers on the Socket_VCC 112. The ripple counter 252 would change to (0,1). The SD path is enabled and selected for testing. Others are similar to procedure (a) and (b).

(d). The test program then, the THIRD time, powers on the Socket_VCC 112. The ripple counter 252 changes to (1,0). The SMC path is enabled and selected for testing. Others are similar to procedure (a) and (b).

(e). The test program then, the Forth time, powers on the Socket_VCC 112. The ripple counter 252 changes to (0,0), The MMC path is enabled and selected for testing. Others are similar to procedure (a) and (b).

Figure 2:
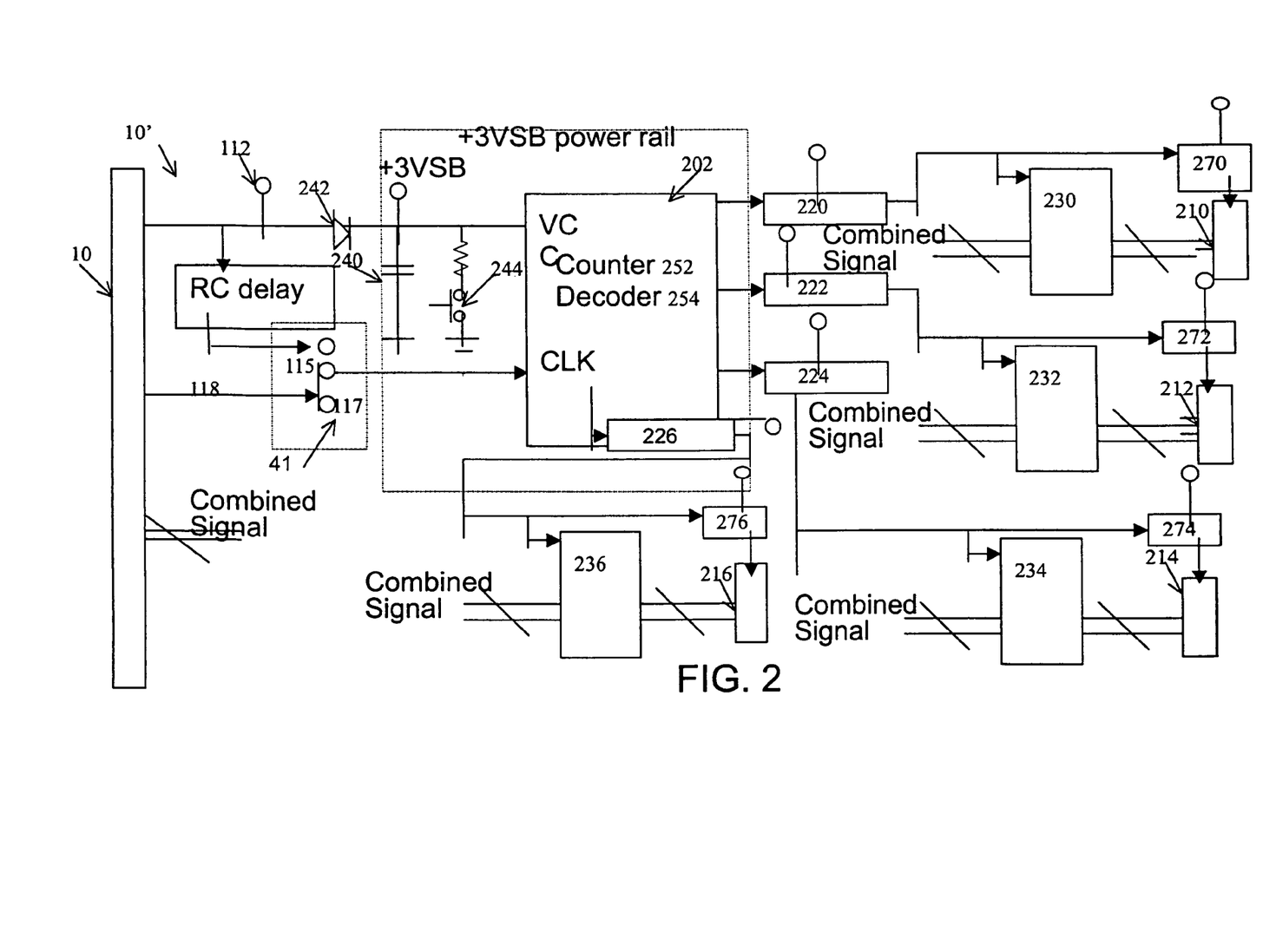
FIG. 2 is a detailed block diagram of another exemplary test card system.

Turning to FIG. 2, a detailed block diagram of another exemplary test card system 10' is depicted. In general, the present embodiment use SQRYDR as the clock source of the state counter by shorting pin 115 and pin 117 of MODE jumper 41 together. SQRYDR 118 is a pin on the CardBay PCMCIA interface 110 and is driven by the CardBay controller to determine the functionality of the CardBay card. Many elements of FIG. 2 are similar to those of the FIG. 1, as such, are labeled similarly. Hence any repetitive description of similar elements that was already detailed with respect to figure 2 is omitted herein for clarity, and rather the differences between FIG. 1 and FIG. 2 are detailed herein. The operation using SQRYDR 118 as clock source of state counter 252 is as the following:

(a). When the test card 10 with MMC, SD, MS, and SMC cards (210, 212, 214, 216) together is inserted into the 68-pin PCMCIA interface 110, the test program needs to, the FIRST time, powers on the Socket_VCC 112. The ripple counter 252 (SQRY3, SQRY4) would be reset to (0,0). Then test program powers OFF Socket_VCC 112. The test program then generates, the First time, SQRYDR pulse 118 to change Ripple Counter 252 to (1,1) and then powers ON Socket_VCC 112 again. The MS path is enabled and selected for testing. After power is stable on MS card 210, test program can RESET the card 210 and start to test it. After finishing the test, test program shows test result to output (display or other devices) and powers OFF the Socket_VCC 112.

(b). Test program takes a short delay here to discharge the Socket_VCC 112. (The delay could not be taken too long because the +3VSB power still needs to keep stable).

(c). The program generates, the SECOND time, SQRYDR pulse 118 to change Ripple Counter 252 to (0,1) and then powers ON Socket_VCC 112 again. The SD/(MMC) path is enabled and selected for testing. Others are similar to procedure (a) and (b).

(d). The program generates, the THIRD time, SQRYDR pulse 118 to change Ripple Counter 252 to (1,0) and then powers ON Socket_VCC 112 again. The SMC path is enabled and selected for testing. Others are similar to procedure (a) and (b). 20 (e). The program generates, the FORTH time, SQRYDR pulse 118 to change Ripple Counter 252 to (0,0) and then powers ON Socket_VCC 112 again. The MMC path is enabled and selected for testing. Others are similar to procedure (a) and (b).

The test procedure described herein could be another simple way as understood by those skilled in art, here is to keep similar to "using Delay_Socket_VCC".

Figure 3:
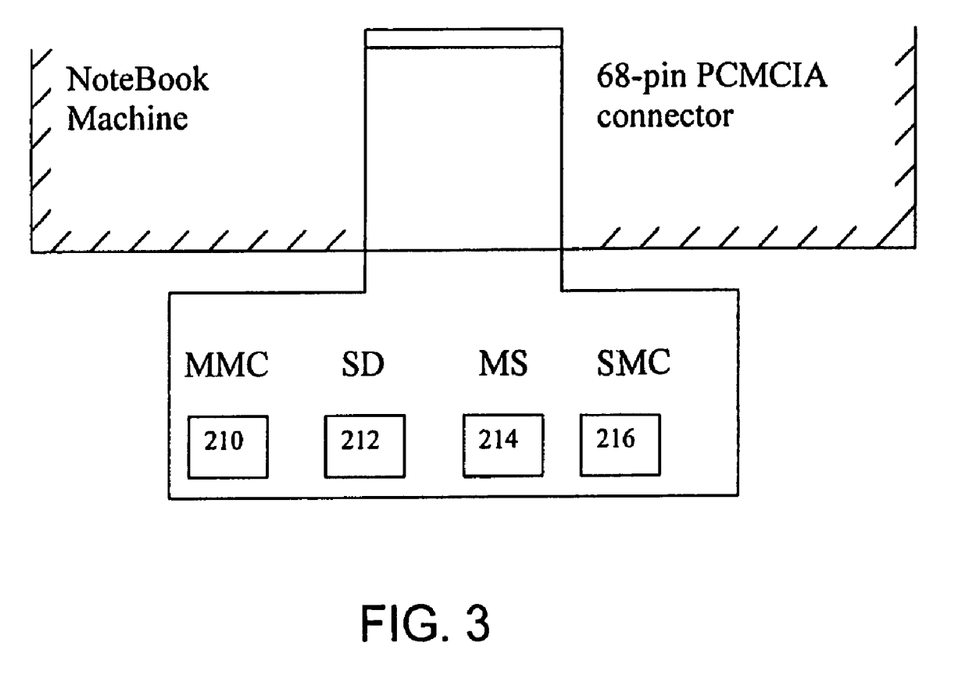
FIG. 3 depicts the general possible shape of the test card applied to a notebook computer system according to the present invention.

FIG. 3 shows a general possible shape of the test card applied to a notebook computer system 20 according to the present invention. The test card 10 with MMC, SD, MS, and SMC cards (210, 212, 214, 216) together is inserted into the 68-pin PCMCIA interface 110 of a Notebook machine 20. Obviously, it can test all MMC, SD, MS, and SMC devices and functions (210, 212, 214, 216) in one time without inserting and removing memory device one by one.

Figure 4:
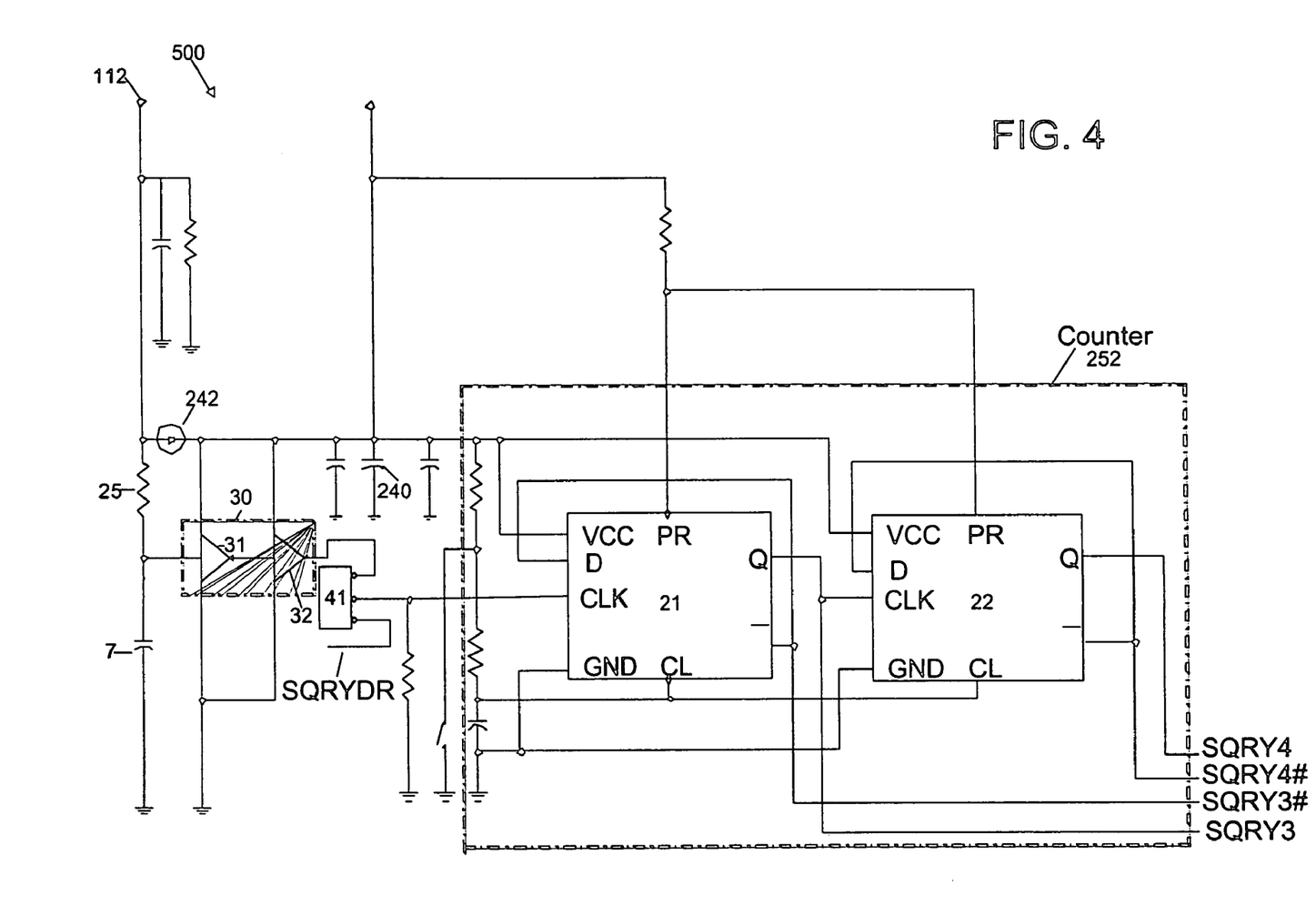
FIG. 4 is a more detailed circuit diagram of a counter consistent with the present invention.

Turning to FIG. 4, a more detailed circuit diagram 500 of a counter consistent with the present invention is depicted. The detailed description of FIG. 4 below will go with reference to FIG. 1 and FIG. 2. Some elements of FIG. 4 are similar to those of the FIG. 1 and FIG. 2, as such, are labeled similarly. Hence any repetitive description of similar elements that was already detailed with respect to FIG. 2 and FIG. 2 is omitted herein for clarity. As shown in FIG. 4, resistor 25 and capacitor 7 comprise the RC delay filter in FIG. 1 and FIG. 2. In one embodiment, resistor 25 and capacitor 7 can be 300 k and 1 uF respectively. It will known by those skilled in art, inverter 31 and 32 comprise the Smith-trigger gates 30. The output of the inverter 32 will provide Delay_Socket_VCC 116 (in FIG. 1 and FIG. 2) to a MODE jumper 41. The other input of MODE jumper 41 is provided from SQRYDR pin 118 of the PCMCIA interface. MODE jumper 41 (3-pin jumper) is used as a jumper to select clock source for the counter 252. Diode 242 is used to separate the +3VSB power rail from Socket_VCC 112 for state machine. The capacitor 240 will be charged during Socket_VCC 112 is On and will keep providing power to keep the state of the state machine when Socket_VCC 112 is temporary OFF. In this embodiment, capacitor 240 is 220 uF. The counter 252 includes two ripple D-triggers 21 and 22. The Q terminal of D-trigger 21 is provided as the clock source of D-trigger 22. It will be understood by those skilled in art that these two ripple D-triggers 21 and 22 comprise a frequency divider/counter. The output of Q terminal of D-trigger 21 is SQRY3 and the output of Q terminal of D-trigger 22 is SQRY4. Similarly, the output of ⃖ terminal of D-trigger 21 is SQRY3# and the output of ⃖ terminal of D-trigger 22 is SQRY4#. Once the ripple D-trigger 21 is triggered by the clock source, the ripple counter output (SQRY3, SQRY4) will change first from (1,1) to (0,1), then (1,0) and (0,0) in the sequence. Thus the outputs SQRY3, SQRY3#, SQRY4, SQRY4# will be further provided to the decoder circuit. As described in the embodiment of FIG. 1, when Socket_VCC 112 is on, if SQRY3 is LOW and SQRY4 is LOW, the MMC path will be enabled; if SQRY3 is HIGH and SQRY4 is HIGH, the MS path will be enabled; if SQRY3 is LOW and SQRY4 is HIGH, the SD path will be enabled; if SQRY3 is HIGH and SQRY4 is LOW, the SM path will be enabled.

Figure 5:
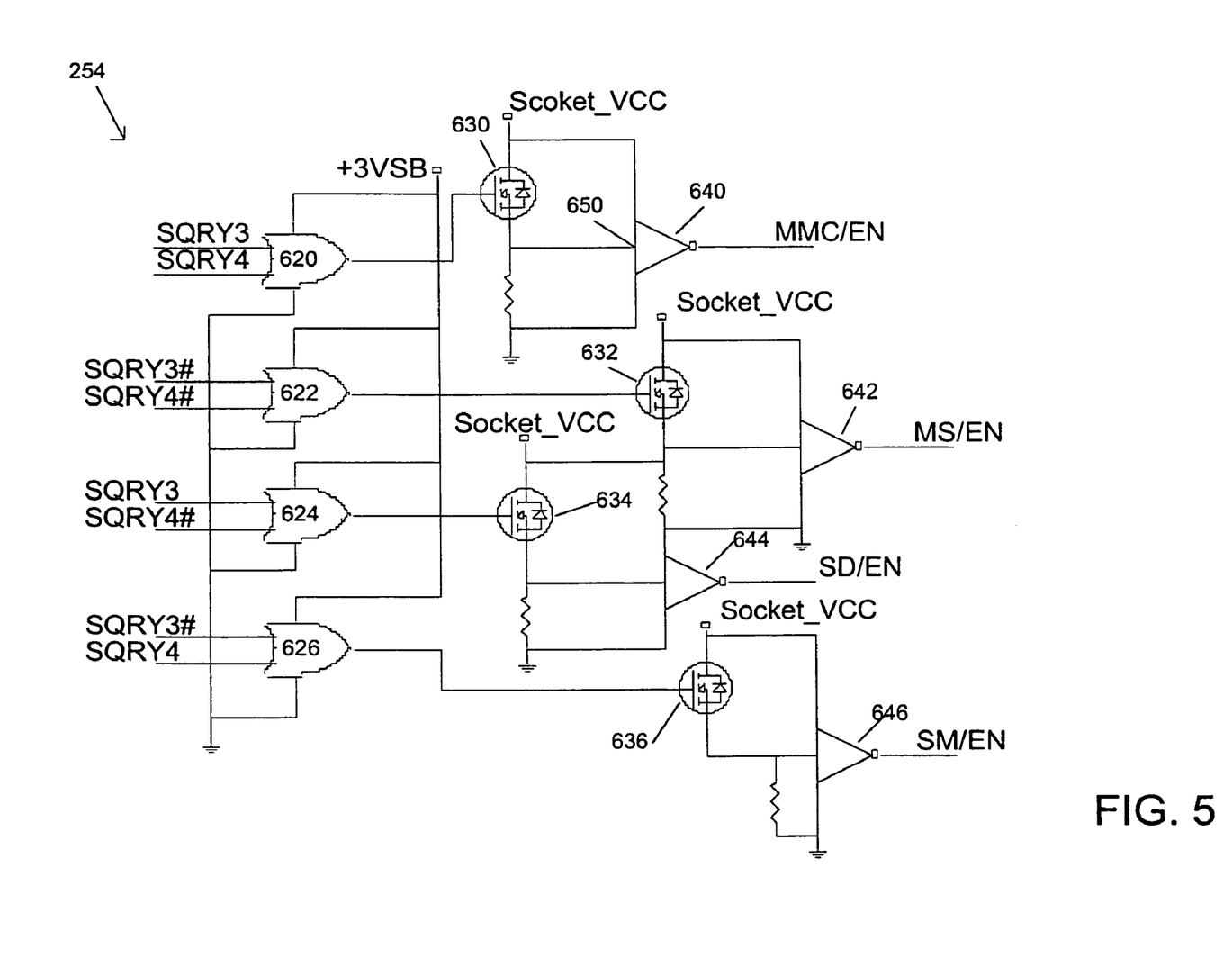
FIG. 5 is a more detailed circuit diagram of a decoder consistent with the present invention.

Turning to FIG. 5, a more detailed circuit diagram of a decoder circuit 254 consistent with the present invention is depicted. Generally, decoder circuit 254 includes a set of OR gates (620, 622, 624, 626), a set of transistors (630, 632, 634, 636) and a set of inverters (640, 642, 644, 646). The inputs of OR gates (620, 622, 624, 626) are (SQRY3, SQRY4), (SQRY3#, SQRY4#), (SQRY3, SQRY4#) and (SQRY3#, SQRY4) respectively. As described in the previous paragraph, when SQRY3 is LOW and SQRY4 is LOW, the MMC path will be enabled. In the present embodiment, when SQRY3 is LOW and SQRY4 is LOW, the output of OR gate 620 is LOW. Therefore, transistor 630 is not conducted, such that the input terminal 650 MMC/EN# of inverter 640 is LOW. As is known in the art, the output of inverter 640 (MMC/EN) which is the enabling signal of MMC path will be changed to HIGH, thus the MMC path is enabled accordingly. If SQRY3 is HIGH and SQRY4 is HIGH, the output of OR gate 622 is LOW. Transistor 632 is not conducted. As described above, thus the output of inverter 642 (MS/EN) which is the enabling signal of MS path will be changed to HIGH. The MS path is enabled. Similarly, in case of SQRY3 is LOW and SQRY4 is HIGH, SD/EN will be HIGH and the SD path will be enabled; in case of SQRY3 is HIGH and SQRY4 is LOW, SM/EN will be HIGH and the SM path will be enabled accordingly.

Figure 6:
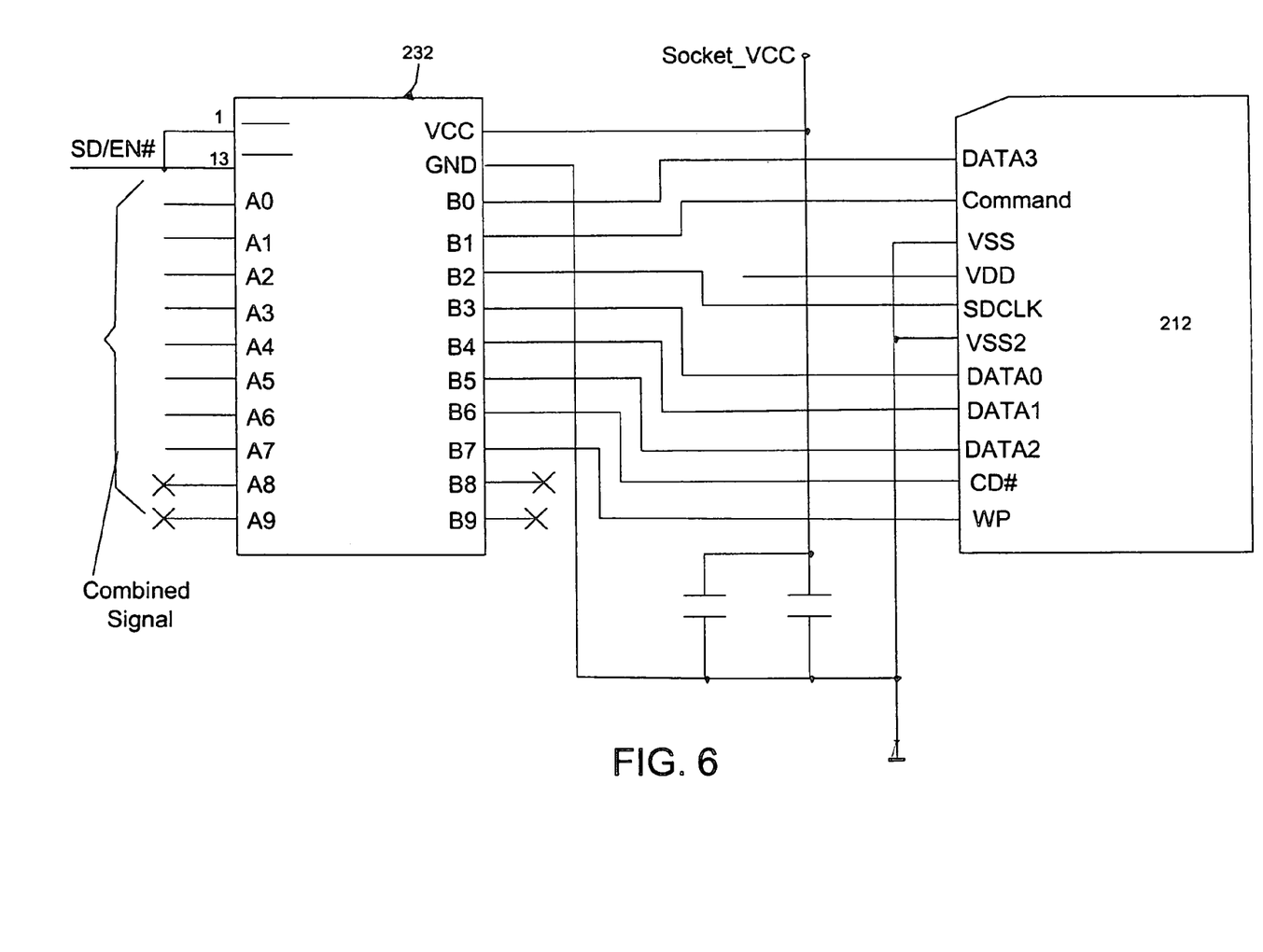
FIG. 6 is a detailed pin arrangement between a Secure Digital socket and a quick switch consistent with the present invention.

FIG. 6 is a detailed pin arrangement between a Secure Digital socket 212 and a quick switch 232 consistent with the present invention. In the present embodiment, quick switch 232 is a 3.3 volt, 10 bit, analog/bus switch. However, any other type of equivalent bus switch can be applied to the present invention. Quick switch 232 is turned ON by the bus enable input signal. There are two bus enable signals ‾‾‾ 1 and ‾‾‾ 13 which are coupled to SD/EN# signal from the decoder circuit 254. The A-side terminals (A0, A1, A2, A3, A4, A5, A6, A7) of the quick switch 232 are coupled to the combined signals which are from the 68 pin PCMCIA interface (A8, A9 are reserved). Terminal VCC of the switch 232 is connected to Socket_VCC and terminal GND is coupled to ground. The B-side terminals of quick switch 232 (B0, B1, B2, B3, B4, B5, B6, B7) are connected to SD socket 212 (DATA3, Command, SDCLK, DATA0, DATA1, DATA2, CD#, WP) (B8, B9 are reserved). VSS and VSS2 are coupled to ground and VDD is the voltage source terminal of SD 212. It is obvious that once the SD/EN# signal is turned to LOW, that is, SD/EN signal is turned to HIGH, the quick switch 232 is thus turned ON and SD path is enabled for testing. The WP terminal of SD 212 can indicate the write protection status of SD card 212. Test program is able to identify the WP pin to know whether SD card 212 is under write protection or not.

Figure 7:
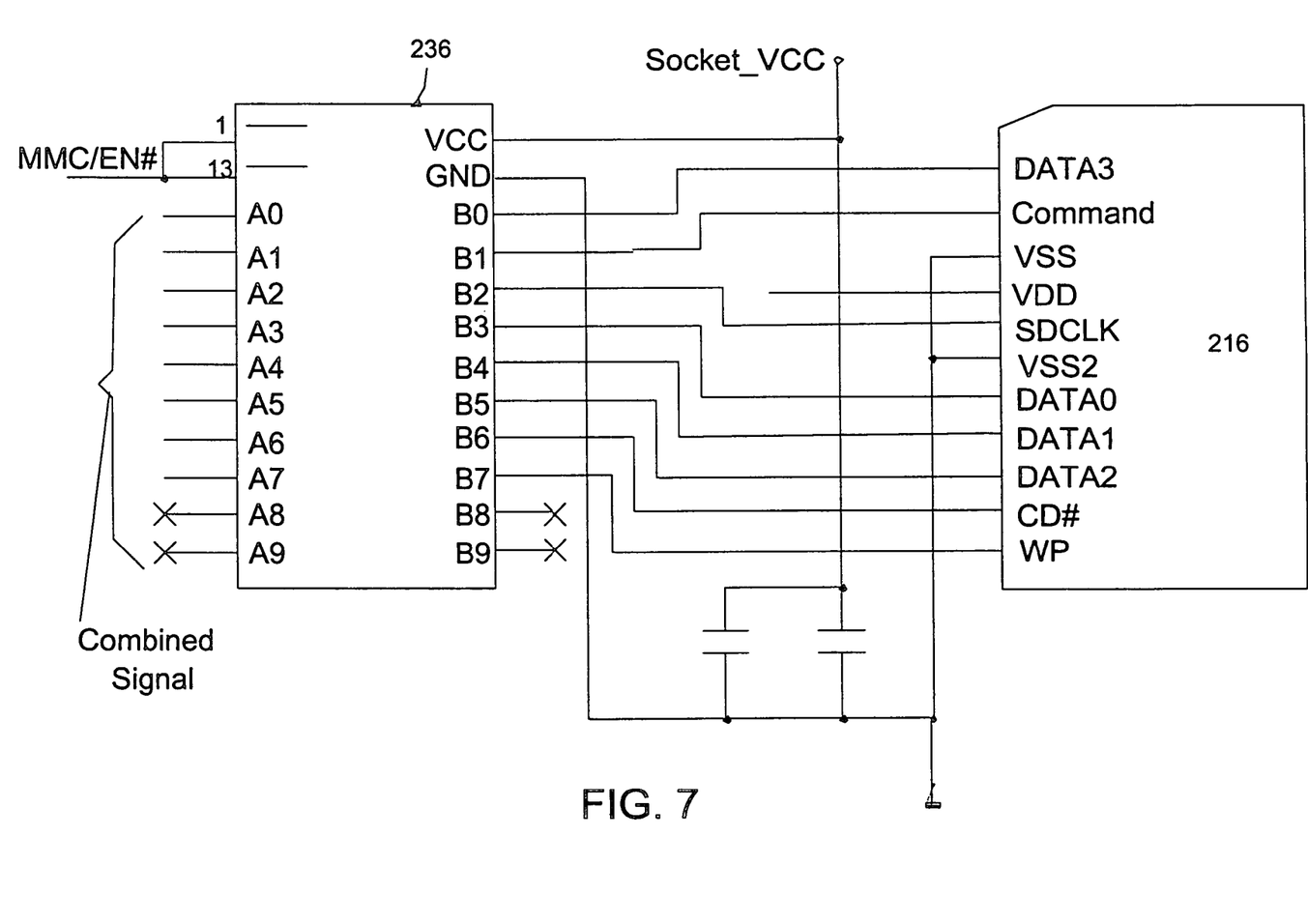
FIG. 7 is a detailed pin arrangement between a MultiMedia Card socket and a quick switch consistent with the present invention.

FIG. 7 is a detailed pin arrangement between a MultiMedia Card socket 216 and a quick switch 236 consistent with the present invention. As detailed described above, similarly, quick switch 236 is a 3.3 volt, 10 bit, analog/bus switch. Some elements which are the same as in FIG. 6 and labled similarly are omitted herein for clarity. There are two bus enable signals ‾‾‾ 1 and ‾‾‾ 13 which are coupled to MMC/EN# signal from the decoder circuit 254. The A-side terminals of the quick switch 236 (A0, A1, A2, A3, A4, A5, A6, A7) are coupled to the combined signals which are from the 68 pin PCMCIA interface (A8, A9 are reserved). The B-side terminals of quick switch 236 (B0, B1, B2, B3, B4, B5, B6, B7) are connected to MMC socket 216 (DATA3, Command, SDCLK, DATA0, DATA1, DATA2, CD#, WP) (B8, B9 are reserved). Likewise, once the MMC/EN# signal is turned to LOW which means MMC/EN signal is turned to HIGH, the quick switch 236 is thus conducted and MMC path is enabled for testing.

Figure 8:
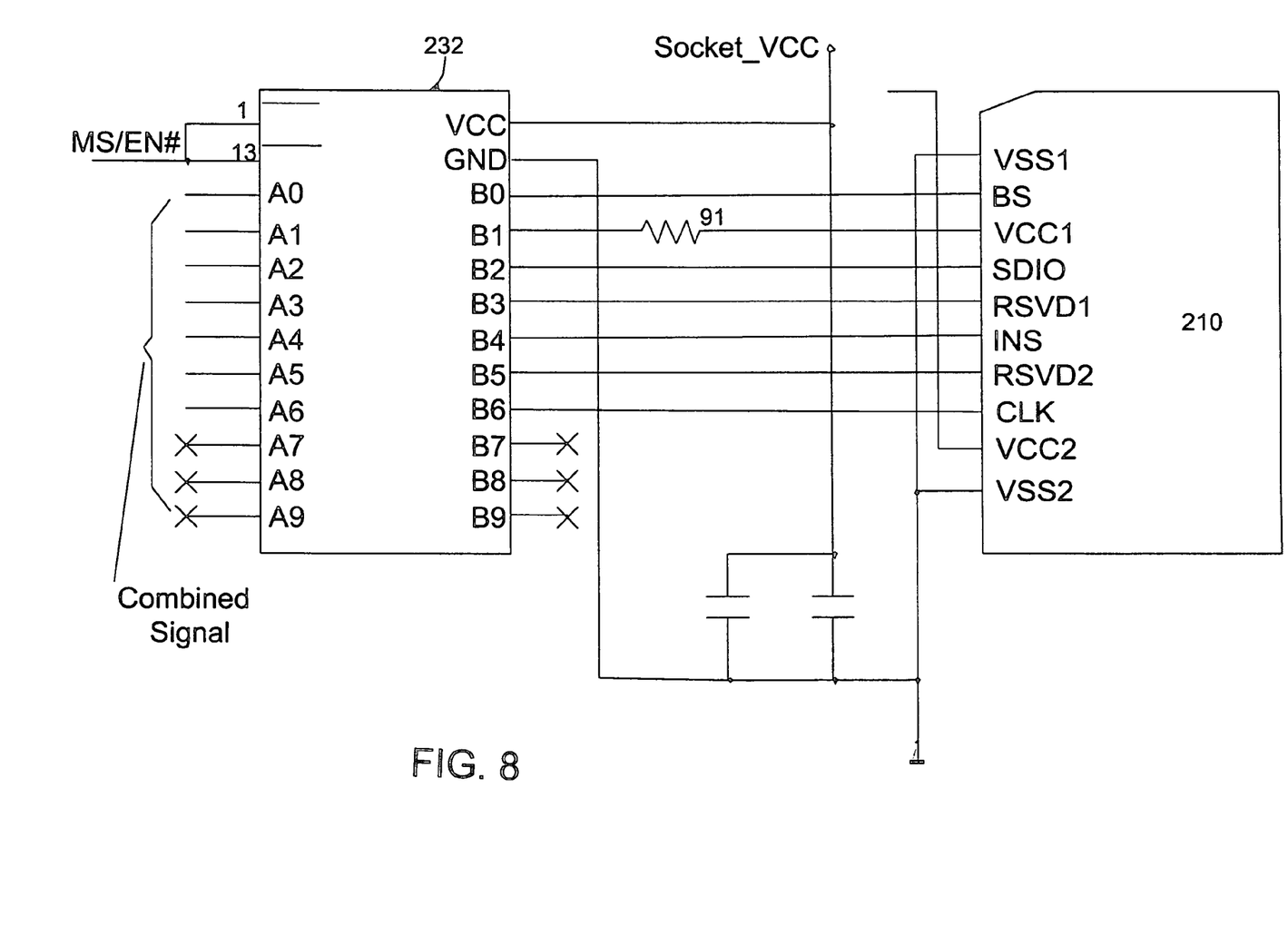
FIG. 8 is a detailed pin arrangement between a Memory Stick socket and a quick switch consistent with the present invention.

Turning to FIG. 8, a detailed pin arrangement between a Memory Stick socket 210 and a quick switch 230 consistent with the present invention is depicted. Likewise, just as detailed in FIG. 6 and FIG. 7, quick switch 230 is a 3.3 volt, 10 bit, analog/bus switch. There are two bus enable signals ‾‾‾ 1 and ‾‾‾ 13 which are coupled to MS/EN# signal from the decoder circuit 254. The A-side terminals of the quick switch 230 (A0, A1, A2, A3, A4, A5, A6) are coupled to the combined signals which are from the 68 pin PCMCIA interface (A7, A8, A9 are reserved). The B-side terminals of quick switch 230 (B0, B1, B2, B3, B4, B5, B6) are connected to MS socket 210 (BS, VCC1, SDIO, RSVD1, INS, RSVD2, CLK) (B7, B8, B9 are reserved). VSS1 and VSS2 are coupled to ground and VCC2 is the voltage source terminal of MS 210. Similarly, once the MS/EN# signal is turned to LOW which means MS/EN signal is turned to HIGH, the quick switch 230 is thus conducted and MS path is enabled for testing. It will be noted by those skilled in art that resistor 91 is coupled between the output terminal of quick switch 230 and the input terminal of the MS socket, which is reserved for MS Pro. Thus the present invention is also applicable to MS Pro, not only limited to MS.

Figure 9:
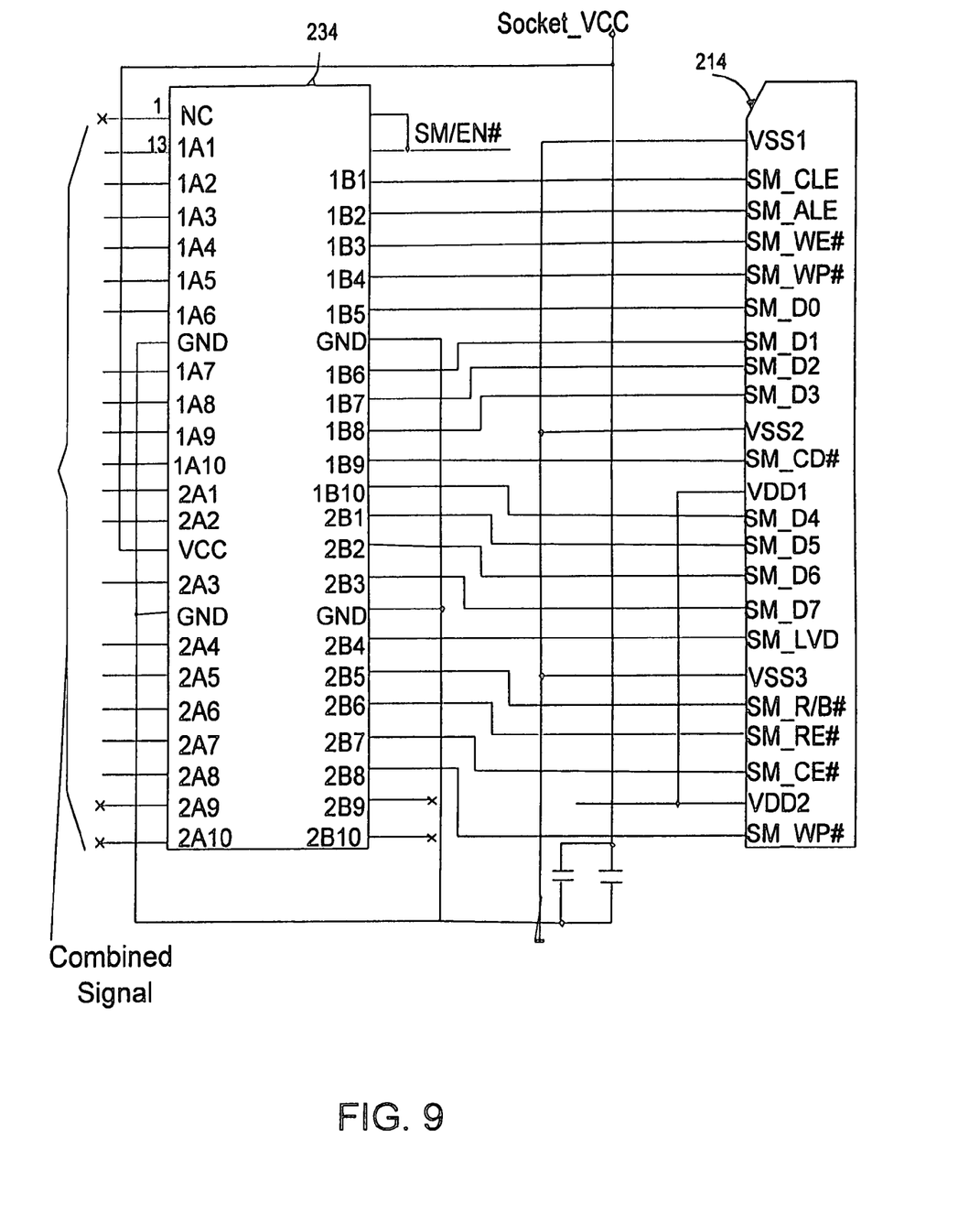
FIG. 9 is a detailed pin arrangement between a Smart Media socket and a quick switch consistent with the present invention.

FIG. 9 is a detailed pin arrangement between a Smart Media socket 214 and a quick switch 234 consistent with the present invention. Different from the embodiments in FIG. 6, 7 and 8, in the present embodiment, quick switch 234 is a 3.3 volt, 20 bit, analog/bus switch. However, any other equivalent bus switch can be applied to the present embodiment. There are two bus enable signals ‾‾‾ 48 and ‾‾‾ 47 which are coupled to SM/EN# signal from the decoder circuit 254. The A-side terminals of the quick switch 234 (1A0, 1A1, 1A2, 1A3, 1A4, 1A5, 1A6, . . . 2A8) are coupled to the combined signals which are from the 68 pin PCMCIA interface (2A9, 2A10 are reserved). The B-side terminals of quick switch 234 (1B1, 1B2, 1B3, 1B4, 1B5, 1B6, . . . , 2B8) are connected to SMC socket 214 (2B9, 2B10 are reserved). Similarly, once the SM/EN# signal is turned to LOW which means SM/EN signal is turned to HIGH, the quick switch 234 is thus turned on and SMC path is then enabled for testing. Likewise, SMC 214 is also support the write protection function. Test program is able to identify the WP pin to know whether SMC 214 is under write protection or not.

Figure 10:
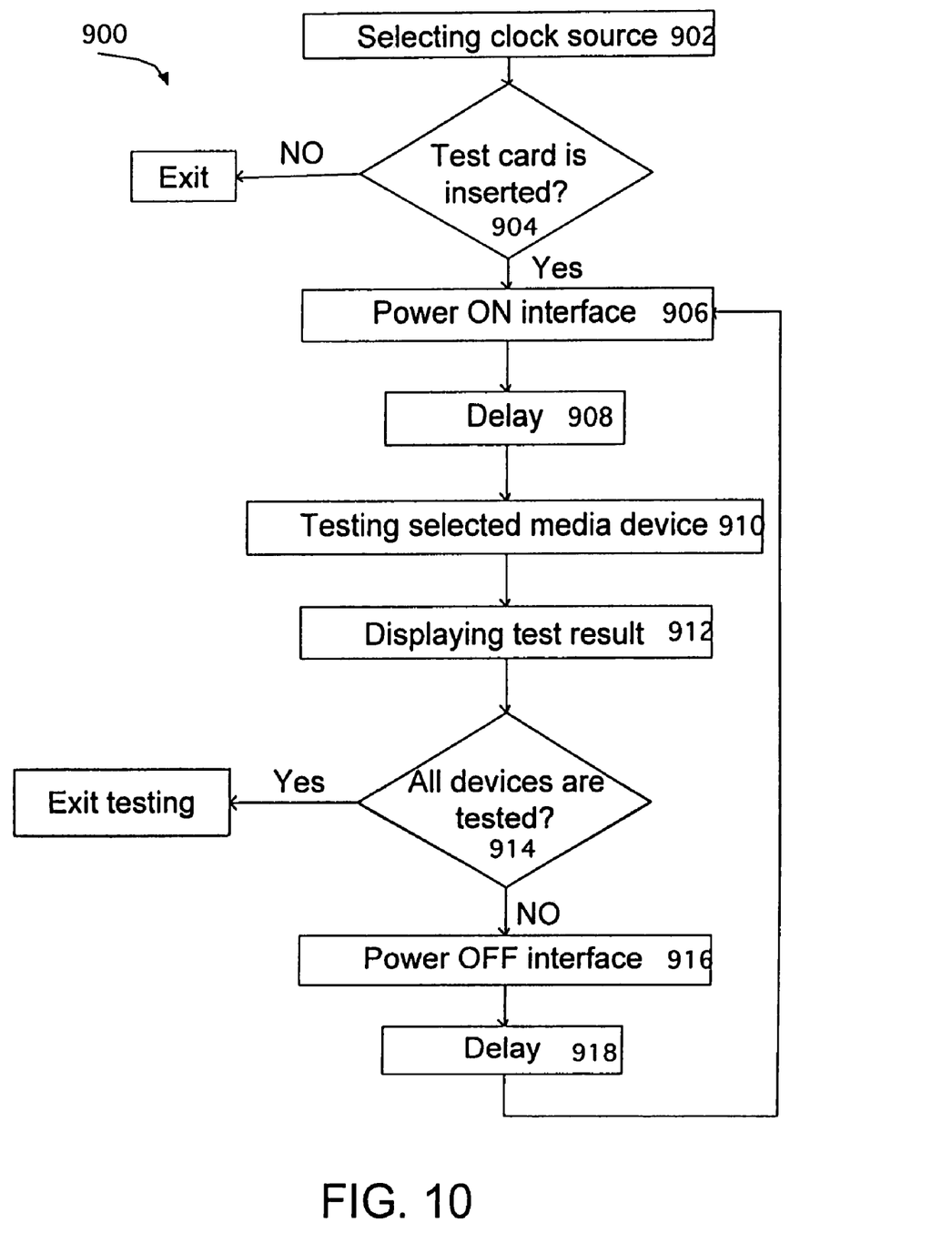
FIG. 10 is a flow chart of a method for testing some or all functions of a PCMCIA/CardBay system in accordance with the present invention.

FIG. 10 shows a flow chart 900 of a method for testing some or all functions of a PCMCIA/CardBay system in accordance with the present invention. The following detailed description goes reference to FIG. 1 and FIG. 2. As shown in the FIG. 10, the test card first selects appropriate clock source either from Delay_socket_VCC 116 or SQRYDR 118 in step 902. As described in FIG. 1, the clock source of counter 252 and decoder 254 is provided either by SQRYDR 118 of PCMCIA interface 110 or by Delay_Socket_VCC 116 which is generated from Socket_VCC 112 through the RC delay filter 262 and Smith-trigger gates. Test program then detects the insertion of the test card in step 904. If it is detected that the test card has not been inserted, the test program will exit. If it is detected that the test card is inserted, the test program will power on PCMCIA interface 110, e.g, Socket_VCC 112 is powered ON in response to the insertion of the test card in step 906. There is a delay after the interface 110 is powered on in order to maintain stable power on the tested media device in step 908. Then the selected media device is tested in step 910 (counter 252 and decoder 254 will generate appropriate outputs (SQRY3, SQRY4) to select corresponding media device). After finishing the test, test program shows the test result to output (display or other devices) in step 912. If all the media devices are tested, the test program will exit. If not, the test program will powers OFF interface 110 a short time in step 916. Also, there is a delay in step 918. Then the step goes back to step 906. Capacitor 240 will maintain stable power while Socker_VCC is temporary OFF.

Therefore, the test card consistent with the present invention can test all SD, MMC, MS (Pro), SMC devices and functions in one time in a bench without inserting and removing the media device one by one, thus accelerates the production line test speed. The test program is also able to detect the existing of media cards in the interface. If the media card does not exist, the test program can skip the test automatically.

As is understood by a person skilled in the art, the foregoing descriptions of the preferred embodiment of the present invention are an illustration of the present invention rather than a limitation thereof. It is intended to cover various modifications and similar arrangements included within the spirit and scope of the appended claims. While a preferred embodiment of the invention has been illustrated and described, it will be appreciated that various changes can be made therein without departing from the spirit and scope of the invention.

What is claimed is:

1. A test device for multiple functions testing comprises:
   a single interface;
   a plurality of media devices, all of which reside together in said single interface; and
   a selection device, wherein said selection device controlled by a clock signal from said single interface generates an enable signal for selecting one media device among said plurality of media devices for testing.

2. The test device as claimed in claim 1 further comprises an isolator configured to reduce the power leakage from said selection device.

3. The test device as claimed in claim 1 further comprises a charge storage configured to keep stable power to said selection device.

4. The test device as claimed in claim 1, wherein said test device is configured for testing a PCMCIA interface.

5. The test device as claimed in claim 1, wherein said media devices includes a secure digital card.

6. The test device as claimed in claim 1, wherein said media devices includes a multi-media card.

7. The test device as claimed in claim 1, wherein said media devices includes a smart media card.

8. The test device as claimed in claim 1, wherein said media devices includes a memory stick card.

9. The test device as claimed in claim 2, wherein said isolator comprises a diode.

10. The test device as claimed in claim 3 further comprises a discharger configured to discharge the power in said charge storage.

11. The test device as claimed in claim 10, wherein said charge storage comprises a capacitor.

12. The test device as claimed in claim 10, wherein said discharger comprises a switch.

13. The test device as claimed in claim 1, wherein said selection device comprises a state machine for generating said enable signal for each of said plurality of media devices.

14. The test device as claimed in claim 13, wherein said state machine comprises a counter configured to provide outputs for selecting said plurality of media devices.

15. The test device as claimed in claim 14, wherein said state machine comprises a decoder configured to decode said outputs of said counter.

16. The test device as claimed in claim 15 further comprises a buffer configured to reduce leakage from said decoder.

17. The test device as claimed in claim 1, wherein said clock signal is provided by a power terminal of said signal interface.

18. The test device as claimed in claim 1 further comprises a media device isolator configured to separate signals from said plurality of media devices.

19. The test device as claimed in claim 18, wherein said media device isolator comprises a switch.

* * * * *